United States Patent [19]

Saito et al.

[11] Patent Number: 5,316,878
[45] Date of Patent: May 31, 1994

[54] PATTERN FORMING METHOD AND PHOTOMASKS USED THEREFOR

[75] Inventors: Tadashi Saito; Hideyuki Jinbo, both of Tokyo, Japan

[73] Assignee: Oki Electric Industry Co., Ltd., Tokyo, Japan

[21] Appl. No.: 894,519

[22] Filed: Jun. 4, 1992

[30] Foreign Application Priority Data

Jun. 19, 1991 [JP] Japan .................................. 3-147092

[51] Int. Cl.$^5$ ....................... G03F 1/08; H01L 21/027
[52] U.S. Cl. ......................................... 430/5; 430/311
[58] Field of Search ..................................... 430/5, 311

[56] References Cited

FOREIGN PATENT DOCUMENTS 0107530 4/1989 Japan ....................................... 430/5
76551/1992 3/1992 Japan .

OTHER PUBLICATIONS

Levenson et al., IEEE Transaction on Electron Devices, "Improving Resolution in Photolithography with a Phase-Shifting Mask", vol. ED-29, No. 12, Dec. 1982, pp. 1828-1836.

Levenson et al., IEEE Transaction on Electron Devices, "The Phase-Shifting Mask II: Image Simulations and Submicrometer Resist Exposures", vol. ED-31, No. 6, Jun. 1984, pp. 753-763.

Jinbo et al., Paper No. 27p-ZG-3, Extended Abstracts, (The 51st Autumn Meeting, 1990); The Japan Society of Applied Physics, No. 2, "0.2 $\mu$m patterning by use of a Phase-shifting Mask".

Jinbo et al., Japanese Journal of Applied Physics, "Improvement of Phase-Shifter Edge Line Mask Method", vol. 30, No. 113, Nov. 1991, pp. 2998-3003.

Primary Examiner—John Kight, III
Assistant Examiner—Rachel Johnson
Attorney, Agent, or Firm—Spencer, Frank & Schneider

[57] ABSTRACT

In a photoresist pattern formation by exposure using first and second photomasks, the first photomask has a transparent part, a rectangular opaque part having a first pair of sides and a second pair of sides, and a phase shifter, having a first edge crossing one of the first pair of sides, so that a part of the first edge is in the transparent part, and the second photomask has a transparent part, a rectangular opaque part corresponding to the rectangular opaque part of the first photomask, and a stripe-shaped opaque part corresponding to the first part of the first edge of the phase shifter. The rectangular opaque part of the first photomask is expanded in the direction of the first pair of sides, while the rectangular opaque part of the second photomask is expanded in the direction the second pair of sides. The amount of expansion is preferably not smaller than a misalignment tolerance.

2 Claims, 6 Drawing Sheets

FIG. 5A
PRIOR ART
FIG. 5B
PRIOR ART
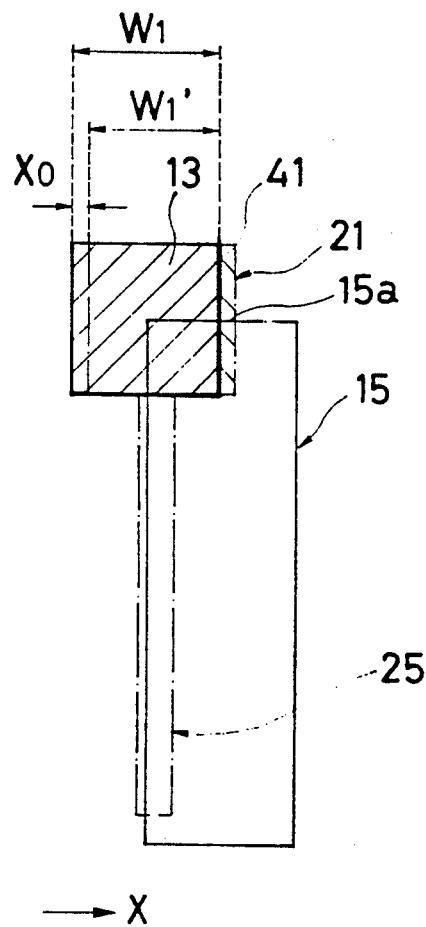
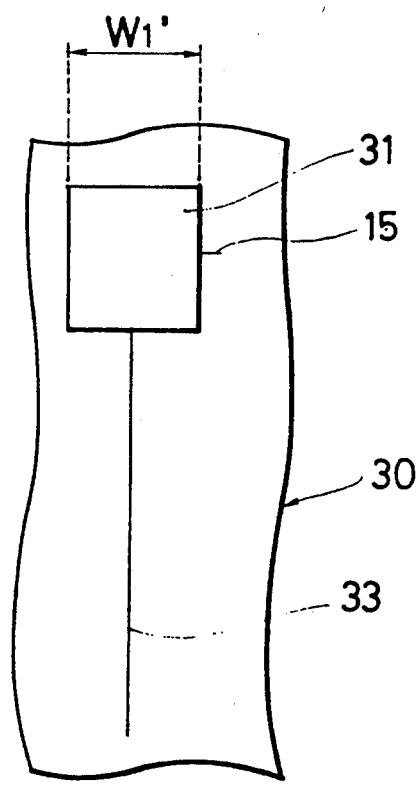

FIG. 6A
PRIOR ART
FIG. 6B
PRIOR ART
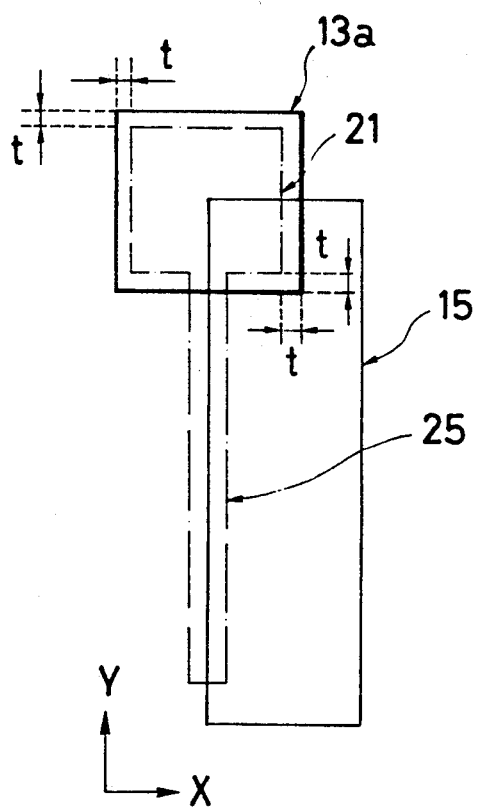
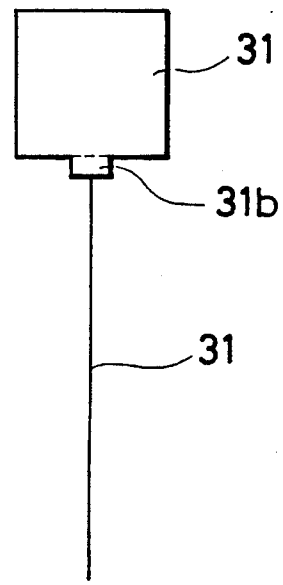

PATTERN FORMING METHOD AND PHOTOMASKS USED THEREFOR

BACKGROUND OF THE INVENTION

The present invention relates to a method for forming a resist pattern employed in a process of fabricating semiconductor devices, and in particular to photomasks used in such a method.

In photolithography by projection exposure, various methods have been proposed which can form fine resist patterns for coping with the packing density increase of semiconductor devices. One technique drawing attention is a phase-shifting mask method.

The phase-shifting mask method was reported, for example, in IEEE Transaction of Electron Devices, Vol. ED-29 (1982), p. 1828, and Vol. ED-31 (1984), p. 753, by Levenson, et al. In the phase-shifting mask method, a phase-shifter in the form of a transparent thin film for shifting the phase of light passing therethrough is disposed partially over the photomask. At the edge of the phase-shifter (the boundary between the area covered by the phase-shifter and the area not covered), the light passing through the phase-shifter and the light not passing through the phase-shifter, each 180° out of phase from each other, interfere with each other, and the light intensity on the wafer is reduced, and the part of the resist along the edge of the phase-shifter is effectively unexposed to the light. By the use of the phase-shifter, the resolution of the projection exposure method is thereby improved.

An application of the phase-shifting mask method is disclosed in Japanese Patent Application No. 190162/1990 and in Paper No. 27p-ZG-3, Extended Abstracts (The 51st Autumn Meeting, 1990); The Japan Society of Applied Physics. This method will be described with reference to FIG. 3A, FIG. 3B and FIG. 4. The drawings show an example in which resist patterns for forming gate patterns having a gate electrode and a pad. FIG. 3A and FIG. 3B are plan views showing the photomasks used, and FIG. 4 is a plan view showing a latent image formed on the resist when the photomasks of FIG. 3A and FIG. 3B are used.

In the illustrated pattern formation method, the photoresist is exposed to light through a first photomask 10 having a transparent part 11, a rectangular opaque part 13 and a phase shifter 15 having part of its edges positioned in the transparent part 11 (FIG. 3A). Another exposure is made using a second photomask 20 having an opaque part 21 corresponding to the opaque part 13 of the first photomask 10 and an opaque part 25 corresponding to an edge of the phase shifter 15 positioned in the transparent part 11 (FIG. 3B).

By the exposure using the first photomask 10, the area of the resist covered by the opaque part 13 does not receive light, and the area along the edge lines of the shifter 15 does not receive light by virtue of the interference (i.e., by the effect of phase-shifter edge line mask) and these areas remain unexposed, while the rest of the area receives light.

By the exposure using the second photomask 20, the areas covered by the opaque parts 21 and 25 do not receive light, while the rest of the area receives light. When the two exposures have been effected, a part 31 which is covered by both of the opaque area 13 of the first photomask 10 and the opaque area 21 of the second photomask 20, and a part 33 which is along the edge lines of the shifter 15 of the first photomask 10, and also is covered by the opaque part 25 of the second photomask 20, remain unexposed, while the rest of the area receives light during the first exposure and/or the second exposure. As a result, a latent image, shown in FIG. 4, consisting of the unexposed parts 31 and the unexposed part 33 is formed.

Where the resist is of the negative type, when the latent image of FIG. 4 is developed, a resist pattern with the unexposed parts 31 and 33 having been removed is obtained. This resist pattern can be utilized for forming a gate electrode and a pad by the lift-off method. Where the resist is of the positive type, when the latent image of FIG. 4 is developed, a resist pattern consisting of the unexposed parts 31 and 33 is obtained. In this case too, the area corresponding to the unexposed part 33 will be a part for forming a gate electrode, and the area corresponding to the unexposed part 31 will be a part for forming a pad of the resist pattern.

With the pattern forming method described above, a resist pattern for forming a rectangular pad and a gate electrode having a line width (corresponding to the gate length) of 0.2 $\mu$m or less can be formed with ease.

A problem associated with the above described pattern forming method is that if the second photomask 20 is not exactly in alignment but is offset relative to the first photomask 10, the area 31 for the pad, which is unexposed through the first and second exposures, is reduced. For instance, if the second photomask 20 is offset in the direction of the length of the gate (horizontal direction in the figure), by X0 as shown in FIG. 5A, the width of the resultant unexposed part 31a will be W1', smaller than the designed width W1 by X0. Moreover, if the second photomask 20 is offset to the right as seen in the figure, a part of the upper horizontal (as seen in the figure) edge of the shifter 15 which is designed to be exposed during the second exposure is not exposed by the area 41 near the right edge of the opaque part 21 (due to the offset X0 of the opaque part 21), so a spike-like unexposed part 15a results, as shown in FIG. 5B.

To avoid the size reduction of the rectangular part and the formation of the spike-like part 15a, the opaque part may be made larger than the designed dimension of the pad, as shown in FIG. 6A. That is, the opaque part 13a of this example is expanded by a predetermined dimension t in all directions as shown in FIG. 6A. The dimension t allows for the misalignment. In this case, however, there will remain an unexposed, projecting part 31b which is covered by the expanded part of the opaque part 13a of the first photomask 10 and by the elongated opaque part 25 of the second photomask 20, as shown in FIG. 6B, so that the resultant pad has a shape different from the designed shape.

SUMMARY OF THE INVENTION

The present invention has been made in view of the above, and its object is to provide a pattern forming method using a first photomask capable of forming, in a resist, an unexposed part of a fine line utilizing an edge of a phase shifter, and a second photomask for exposing the unnecessary part of the unexposed part of the fine line, with both photomasks having a rectangular opaque part to form an unexposed part at an area, wherein misalignment between the two photomasks will not change the shape and the size of the area of the resultant latent image.

A pattern forming method according to the invention includes the steps of:

preparing a first photomask having a transparent part, a rectangular opaque part having a first pair of sides and a second pair of sides, and a phase shifter, having a first edge crossing a first one of the first pair of sides of the rectangular opaque part, so that a first part of the first edge is in the transparent part and a second part of the first edge is in the opaque part, and having a second edge crossing a first one of the second pair of sides of the rectangular opaque part, so that a first part of the second edge is in the transparent part and a second part of the second edge is in the opaque part;

preparing a second photomask having a transparent part, a rectangular opaque part corresponding to the rectangular opaque part of the first photomask, and a stripe-shaped opaque part corresponding to the first part of the first edge of the phase shifter, with the stripe-shaped opaque part having one end connected to the rectangular opaque part of the second photomask;

conducting exposure using the first photomask; and conducting exposure using the second photomask before or after the exposure using the first photomask;

wherein the rectangular opaque part of the first photomask is expanded in the direction of the first pair of sides and is not expanded in the direction of the second pair of sides; and the rectangular opaque part of the second photomask is expanded in the direction of the second pair of sides and is not expanded in the direction of the first pair of sides.

BRIEF DESCRIPTION OF THE DRAWINGS

FIG. 5A is a plan view showing misalignment between the first and second photomasks of FIG. 3A and FIG. 3B.

FIG. 5B is a plan view showing an undesirable spike-like part due to the misalignment illustrated in FIG. 5A.

FIG. 6A is a plan view showing a photomask in another example of the prior art.

FIG. 6B is a plan view showing an undesirable projecting part which is formed when the photomask of FIG. 6A is employed.

DETAILED DESCRIPTION OF THE PREFERRED EMBODIMENTS

Figure 1B:
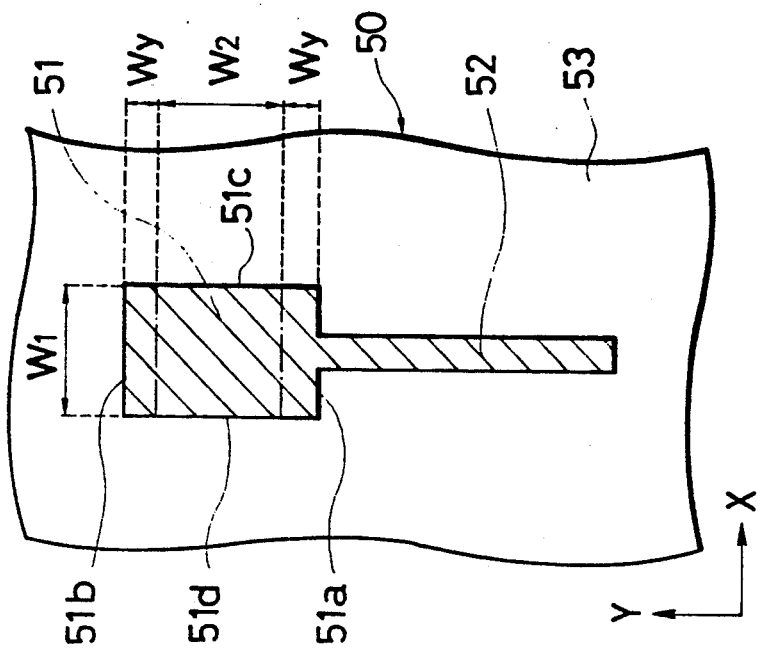
FIG. 1A and FIG. 1B are plan views showing first and second photomasks according to the invention.
Figure 1A:
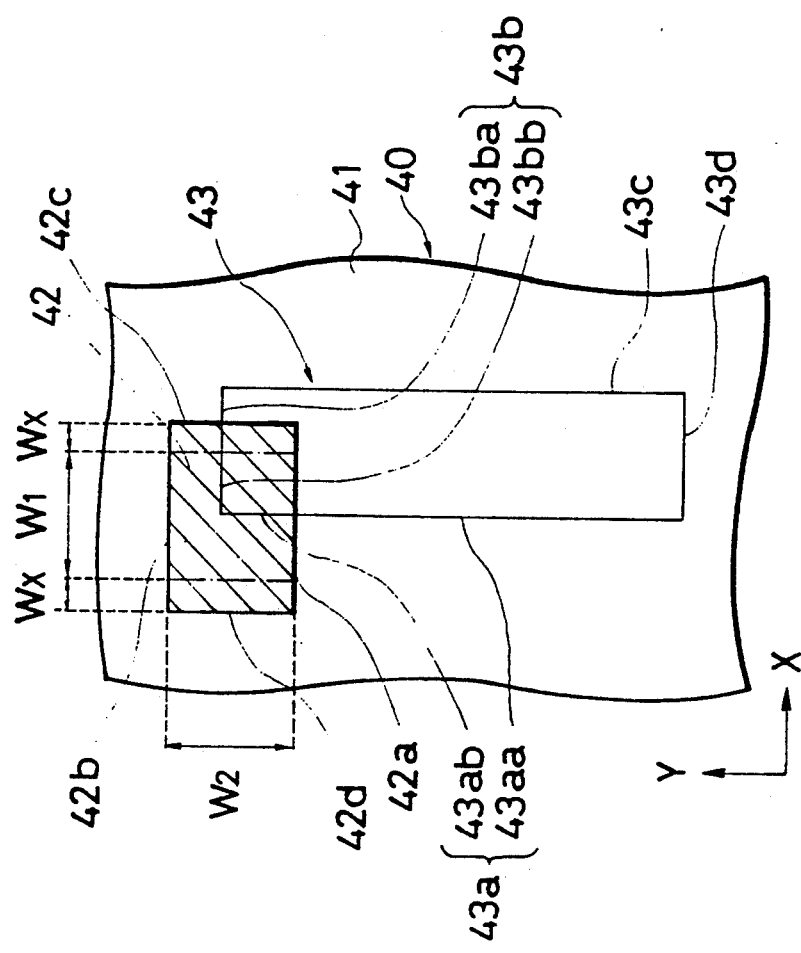

An embodiment of the invention will now be described with reference to the drawings. In the embodiment described below, the invention is applied to a method of forming a gate pattern having a gate electrode and a pad. FIG. 1A and FIG. 1B are plan views showing a first photomask 40, and a second photomask 50. The dimensions, shapes and the layout are illustrative of the nature of the invention, and are not necessarily proportional to those in actual examples.

As illustrated in FIG. 1A, the first photomask 40 has a transparent part 41, a rectangular opaque part 42, and a phase shifter 43.

The rectangular opaque part 42 has a first pair of sides 42a and 42b parallel with each other and a second pair of sides 42c and 42d parallel with each other and perpendicular to the first pair of sides 42a and 42b.

The phase shifter 43 has a first edge 43a crossing a first one 42a of the first pair of sides of the rectangular opaque part 42, so that a first part 43aa of the first edge 43a is in the transparent part 41 and a second part 43ab of the first edge 43a is in the opaque part 42. The phase shifter 43 also has a second edge 43b crossing a first one 42c of the second pair of sides of the rectangular opaque part 42, so that a first part 43ba of the second edge 43b is in the transparent part 41 and a second part 43bb of the second edge 43b is in the opaque part 42. In the illustrated embodiment, the first edge 43a is perpendicular to the first one 42a of the first pair of sides, and the second edge 43b is perpendicular to the second one 42c of the second pair of sides. The phase shifter 43 further has a third edge 43c and a fourth edge 43d.

As illustrated in FIG. 1B, the second photomask 50 has a transparent part 53, a rectangular opaque part 51, and an elongated, stripe-shaped opaque part 52. The rectangular opaque part 51 corresponds to the rectangular opaque part 42 of the first photomask 40. The stripe-shaped opaque part 52 corresponds to a part of the first part 43aa (the entirety of the first part 43aa except its lower (as seen in the figure) end part) of the first edge 43a of the phase shifter 43. The stripe-shaped opaque part 52 is wide enough to allow for misalignment tolerance Wx, between the first and the second photomasks 40 and 50 in the direction (X direction) perpendicular to the direction of its length (Y direction). The misalignment tolerance is the amount of misalignment that needs to be allowed for in view of the error in the operation of the projection reduction exposure device.

The rectangular opaque part 42 of the first photomask 40 is expanded, relative to the dimension corresponding to the designed pad, in the direction of its first pair of sides 42a and 42b. The amount of expansion is Wx in each direction. This amount of expansion Wx is substantially equal to or slightly larger than the misalignment tolerance in such direction. In other words, misalignment of one of the first and second photomasks relative to the other within the range of +Wx needs to be allowed for.

As a result, the first pair of sides 42a and 42b of the rectangular opaque part 42 of the first photomask 40 have a dimension (W1±2Wx) greater by 2Wx than the dimension W1 corresponding to the designed dimension of the pad in the same direction.

The rectangular opaque part 42 is not expanded in the directions of the second pair of sides 42c and 42d, and has a dimension W2 corresponding to the designed pad. That is, the second pair of sides 42c and 42d of the rectangular opaque part 42 of the first photomask 42 have the dimension W2 corresponding to the designed dimension of the pad.

The rectangular opaque part 51 of the second photomask 50 is expanded, relative to the dimension corresponding to the designed pad, in the direction of its second pair of sides 51c and 51d. The amount of expansion is Wy in each direction. This amount of expansion Wy is substantially equal to or slightly larger than the misalignment tolerance in such direction. In other words, misalignment of one of the first and second photomasks relative to the other within the range of ±Wy needs to be allowed for.

As a result, the second pair of sides 51c and 51d of the rectangular opaque part 51 of the second photomask 50 have a dimension (W2+2Wy) greater by 2Wy than the dimension W2 corresponding to the designed dimension of the pad in the same direction.

The rectangular opaque part 51 is not expanded in the directions of the first pair of sides 51a and 51b, and has a dimension W1 corresponding to the designed pad. That is, the first pair of sides 51a and 51b of the rectangular opaque part 51 of the first photomask 51 have the dimension W1 corresponding to the designed dimension of the pad.

The expressions "dimension corresponding to the designed pad" or "dimension corresponding to the designed dimension of the pad" are used because the pattern on the photomask is projected, being reduced by a reduction factor during the exposure by the projection exposure device.

The "dimension corresponding to the designed pad" and "dimension corresponding to the designed dimension of the pad" may be called a designed dimension of opaque part.

The amount of expansions Wx and Wy may be larger than the misalignment tolerance from the viewpoint of preventing the size reduction of the pad and preventing the spike-like part 15a (FIG. 5B). But larger dimension may interfere with other patterns in the vicinity, so the dimension should not be unnecessarily large.

The amounts of expansion Wx and Wy need not be different from each other but may be identical to each other. Moreover, the dimensions W1 and W2 of the first and second pair of sides may not be different and may be identical to each other.

Figure 2B:
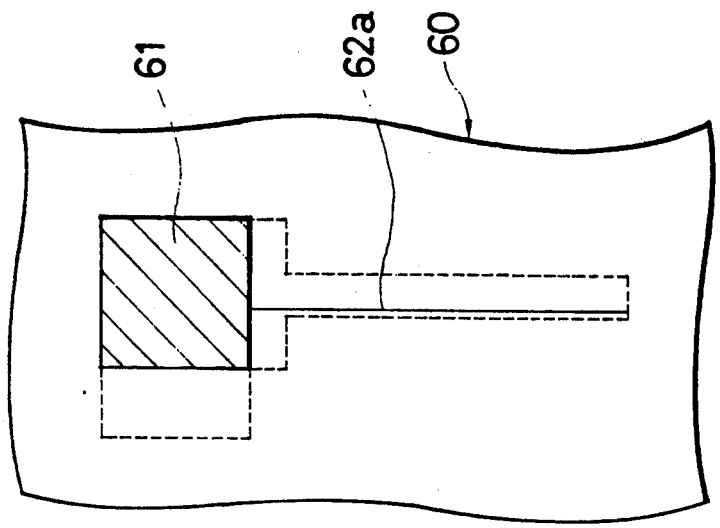
FIG. 2A and FIG. 2B are plan views showing latent images formed by the use of the photomasks of FIG. 1A and FIG. 1B.
Figure 2A:
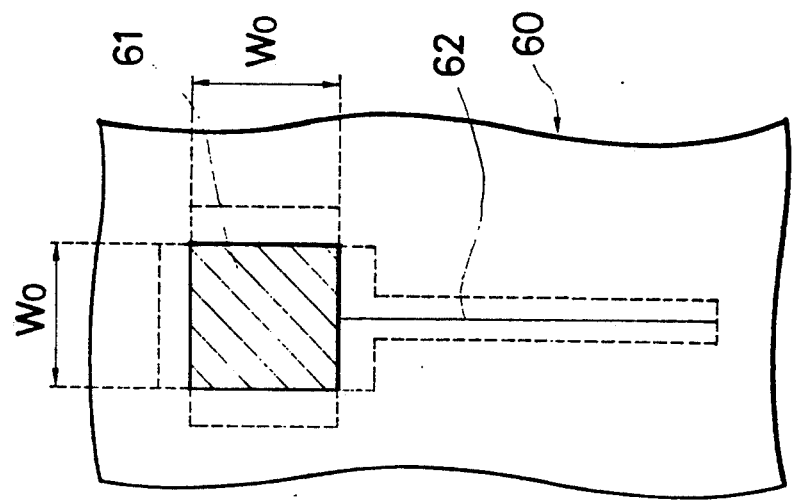

The resist is subjected to exposure through the first photomask, and then exposure through the second photomask. When the two exposures are completed, and if the misalignment in the X and Y directions are both within the tolerance values ±Wx and ±Wy, an unexposed rectangular part 61 having the dimensions of W1 and W2, and an unexposed part 62 of a fine line pattern are created. The areas along the edge lines 43c and 43d and the part 43bb of the edge line 43b, and the lower end of the edge line 43a of the first photomask 40 are exposed during the exposure using the second photomask 50. If the second photomask is offset relative to the first photomask by an amount (Wxa) smaller than Wx in the X direction, the unexposed part 62 of the fine line pattern is offset by such an amount (Wxa) from the center of the unexposed part 61, as shown in FIG. 2B. But this offset does not cause any serious problem. The unexposed part 62 of the fine line pattern can be used for forming a gate electrode, while the rectangular unexposed part 61 can be used for forming a pad.

Even if the first and second photomasks are offset in the Y direction, the resultant rectangular unexposed part 61 will also have the dimensions of W1 and W2 in the X and Y directions. Thus, the use of the above described photomasks ensures that the rectangular pattern having the designed dimensions in the X and Y directions can be obtained, even if there occurs misalignment in the X and/or Y directions.

Figure 3B:
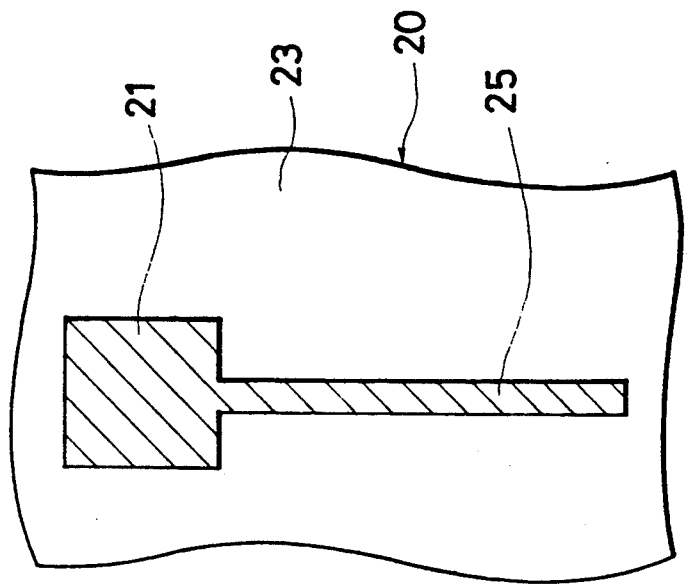
FIG. 3A and FIG. 3B are plan views showing first and second photomasks in the prior art.
Figure 3A:
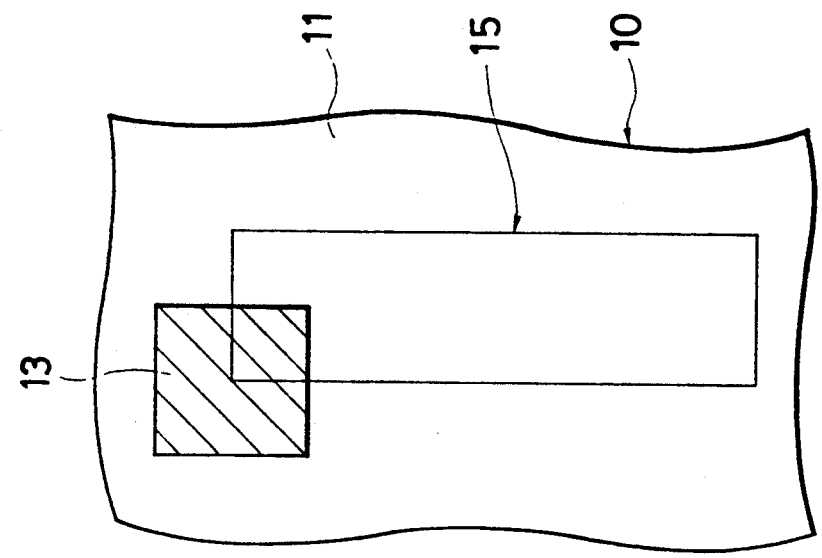
Figure 4:
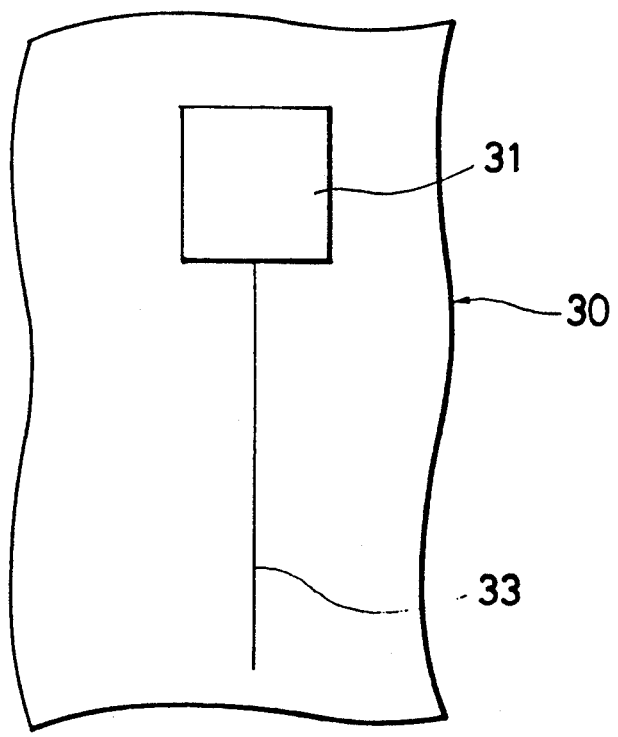
FIG. 4 is a plan view showing a latent image formed in the resist if the first and second photomasks of FIG. 3A and FIG. 3B are in exact alignment.

Moreover, the spike-like part 15a (FIG. 5B), which results when the photomasks of FIG. 3A and FIG. 3B are used and the second photomask is offset to the right, is not formed. This is because the first part 43ba of the edge 43b of the phase shifter 43 is entirely exposed during the exposure using the second photomask 50 having the dimension W1 smaller than the dimension of the rectangular opaque part 42. Furthermore, the projecting part 31b (FIG. 6B) which results if the photomask of FIG. 6A is used, is not formed since such part is exposed during the exposure using the first photomask 40.

The exposure using the second photomask has been described as being carried out after the exposure using the first photomask. But the order of the exposures may be reversed: the exposure using the first photomask may be carried out after the exposure using the second photomask.

The invention is applicable to formation of patterns other than the gate pattern described above, and is applicable to any situation in which a rectangular pattern and a conductor line pattern are formed.

What is claimed is:

1. A method for forming patterns, comprising the steps of:
   preparing a first photomask having a first transparent part, a first rectangular opaque part having a first side and a second side perpendicular to the first side, and a phase shifter having a third side crossing the first side, the third side having a first part defined in the first rectangular transparent part, having a second part defined in the first rectangular opaque part and perpendicular to the first side;
   preparing a second photomask having a second transparent part, a second rectangular opaque part corresponding to the first rectangular opaque part, and a stripe-shaped opaque part corresponding to the first part of the third side, having one end connected to the second rectangular opaque part and being wide enough to allow for misalignment between the first and second photomasks;
   conducting a first exposure using the first photomask; and
   conducting a second exposure using the second photomask before or after the first exposure;
   wherein the first rectangular opaque part is expanded in the direction of the first side by an amount not smaller than a misalignment tolerance in the direction of the first side and is not expanded in the direction of the second side; and
   the second rectangular opaque part is expanded in the direction of the second side by an amount not smaller than a misalignment tolerance in the direction of the first side.

2. Photomasks for use in a pattern formation comprising:
   a first photomask having a first transparent part, a first rectangular opaque part having a first side, and a second side perpendicular to the first side, and a phase shifter having a third side crossing the first side, the third side having a first part defined in the first transparent part, having a second part defined in the first rectangular opaque part and perpendicular to the first side; and
   a second photomask having a second transparent part, a second rectangular opaque part corresponding to the first rectangular opaque part, and a stripe-shaped opaque part corresponding to the first part of the third side, having one end connected to the second rectangular opaque part and wide enough to allow for misalignment between the first and second photomasks;

wherein the first rectangular opaque part is expanded in the direction of the first side by an amount not smaller than a misalignment tolerance in the direction of the first side and is not expanded in the direction of the second side; and wherein the second rectangular opaque part is expanded in the direction of the second side by an amount not smaller than a misalignment tolerance in the direction of the second side and is not expanded in the direction of the first side.

* * * * *